(12) United States Patent
Aminpur et al.

(10) Patent No.: US 6,482,726 B1
(45) Date of Patent: Nov. 19, 2002

(54) CONTROL TRIMMING OF HARD MASK FOR SUB-100 NANOMETER TRANSISTOR GATE

(75) Inventors: Massud Aminpur, Dresden (DE); David Wu, Austin, TX (US); Scott Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/690,152

(22) Filed: Oct. 17, 2000

(51) Int. Cl.[7] ................ H01L 21/3205; H01L 21/4763; H01L 21/336; H01L 21/8234
(52) U.S. Cl. .................. 438/585; 438/592; 438/197
(58) Field of Search ................ 438/585, 592, 438/183, 197, 231, 671, 636, 717, 595; 134/1.2

(56) References Cited

U.S. PATENT DOCUMENTS

| | | | |
|---|---|---|---|
| 5,604,138 A | 2/1997 | Lee et al. | 437/41 |
| 5,989,967 A | 11/1999 | Gardner et al. | 438/305 |
| 6,013,570 A | * 1/2000 | Yu et al. | 438/595 |
| 6,103,559 A | * 8/2000 | Gardner et al. | 438/183 |
| 6,136,679 A | * 10/2000 | Yu et al. | 438/592 |
| 6,283,131 B1 | * 9/2001 | Chen et al. | 134/1.2 |

FOREIGN PATENT DOCUMENTS

EP          0 649 166          10/1994          ......... H01L/21/033

* cited by examiner

Primary Examiner—John F. Niebling
Assistant Examiner—Walter L. Lindsay, Jr.
(74) Attorney, Agent, or Firm—Williams, Morgan & Amerson, P.C.

(57) ABSTRACT

A method is provided, the method including forming a gate dielectric layer above a substrate layer, forming a gate conductor layer above the gate dielectric layer, forming a first hard mask layer above the gate conductor layer, and forming a second hard mask layer above the first hard mask layer. The method also includes forming a trimmed photoresist mask above the second hard mask layer, and forming a patterned hard mask in the second hard mask layer using the trimmed photoresist mask to remove portions of the second hard mask layer, the patterned hard mask having a first dimension. The method further includes forming a selectively etched hard mask in the first hard mask layer by removing portions of the first hard mask layer adjacent the patterned hard mask, the selectively etched hard mask having a second dimension less than the first dimension, and forming a gate structure using the selectively etched hard mask to remove portions of the gate conductor layer above the gate dielectric layer.

20 Claims, 13 Drawing Sheets

CONTROL TRIMMING OF HARD MASK FOR SUB-100 NANOMETER TRANSISTOR GATE

BACKGROUND OF THE INVENTION

1. Field of the Invention

This invention relates generally to semiconductor fabrication technology, and, more particularly, to techniques for manufacturing semiconductor devices with reduced critical dimensions.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g, channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the size, or scale, of the components of a typical transistor also requires being able to form and pattern components such as the gate conductor and gate dielectric on such reduced scales, consistently, robustly and reproducibly, preferably in a self-aligned manner. The ability to form and pattern components such as the gate conductor and gate dielectric on such reduced scales, consistently, robustly and reproducibly, is limited by, among other things, physical limits imposed by photolithography. Diffraction effects impose limits on the critical dimensions of components such as gate conductors and gate dielectrics that correspond roughly to the wavelengths of the light used to perform the photolithography. Retooling wafer fabs to use shorter wavelengths, as in deep ultraviolet (DUV) photolithography and/or in high-energy electron beam lithography, is very expensive.

One conventional approach to achieving reduced critical dimensions, resorting to expensive DUV photolithography and/or high-energy electron beam lithography, is schematically illustrated in FIGS. 1–4. As shown in FIG. 1, for example, a conventional MOS transistor 100 may be formed on a semiconducting substrate 105, such as doped-silicon. The MOS transistor 100 may have a doped-polycrystalline silicon (doped-polysilicon or doped-poly) gate conductor such as an N$^+$-doped-poly (P$^+$-doped-poly) gate 110 formed above a gate oxide 115 formed above the semiconducting substrate 105. The N$^+$-doped-poly (P$^+$-doped-poly) gate 110 and the gate oxide 115 may be separated from active areas such as N$^+$-doped (P$^+$-doped) source/drain regions 120 of the MOS transistor 100 by dielectric spacers 125. The dielectric spacers 125 may be formed above N$^-$-doped (P$^-$-doped) source/drain extension (SDE) regions 130. As shown in FIG. 1, shallow trench isolation (STI) regions 140 may be provided to isolate the MOS transistor 100 electrically from neighboring semiconductor devices such as other MOS transistors (not shown).

The N$^-$-doped (P$^-$-doped) SDE regions 130 are typically provided to reduce the magnitude of the maximum channel electric field found close to the N$^+$-doped (P$^+$-doped) source/drain regions 120 of the MOS transistor 100, and, thereby, to reduce the associated hot-carrier effects. The lower (or lighter) doping of the N$^-$-doped (P$^-$-doped) SDE regions 130, relative to the N$^+$-doped (P$^+$-doped) source/drain regions 120 of the MOS transistor 100 (lower or lighter by at least a factor of two or three), reduces the magnitude of the maximum channel electric field found close to the N$^+$-doped (P$^+$-doped) source/drain regions 120 of the MOS transistor 100, but increases the source-to-drain resistances of the N$^-$-doped (P$^-$-doped) SDE regions 130.

As shown in FIG. 1, typically the N$^+$-doped-poly (P$^+$-doped-poly) gate 110 and the gate oxide 115 have a critical dimension $\delta_{DUV}$ that effectively determines a channel length $\lambda$ of the MOS transistor 100. The channel length $\lambda$ is the distance between the N$^-$-doped (P$^-$-doped) SDE regions 130 adjacent the N$^+$-doped-poly (P$^+$-doped-poly) gate 110 and the gate oxide 115.

As shown in FIGS. 2–4, typically the critical dimension $\delta_{DUV}$ of the N$^+$-doped-poly (P$^+$-doped-poly) gate 110 and the gate oxide 115 is determined as follows. As shown in FIG. 2, a gate oxide layer 215 is formed above the semiconducting substrate 105, and a gate conductor layer 210 is formed above the gate oxide layer 215. An antireflective coating (ARC) layer 230 is formed above the gate conductor layer 210. For the sake of comparison, a photoresist layer 220 is shown, as if formed and patterned using conventional non-DUV photolithography, above the ARC layer 230. The photoresist layer 220 is patterned to have a smallest, non-deep ultraviolet diffraction-limited dimension $\delta_{non-DUV}$ that may be larger than about 1800 Å.

As shown in FIG. 3, a photoresist mask 320 is formed and patterned, using conventional DUV photolithography and/or high-energy electron beam lithography, above the ARC layer 230. The photoresist layer 220 is indicated in phantom, for the sake of comparison. The photoresist mask 320 will typically have the smallest, deep ultraviolet diffraction-limited critical dimension $\delta_{DUV}$ that may be about 1800 Å that will determine the size of the N$^+$-doped-poly (P$^+$-doped-poly) gate 110 and the gate oxide 115.

As shown in FIG. 4, the photoresist mask 320 having the critical dimension $\delta_{DUV}$ is used as a mask to remove respective portions 410 (shown in phantom) from the gate conductor layer 210 (FIGS. 2–3) to form a gate structure 400 that includes the N$^+$-doped-poly (P$^+$-doped-poly) gate 110 and a portion of the gate oxide layer 215 that will eventually become the gate oxide 115 after subsequent etching and/or processing. The gate structure 400, and, hence the N$^+$-doped-poly (P$^+$-doped-poly) gate 110, will also have the critical dimension $\delta_{DUV}$ defined by the photoresist mask 320. Nevertheless, the critical dimension $\delta_{DUV}$ defined by the photoresist mask 320 and total etch is still too large. It would be desirable to have a less expensive technique that would be sufficiently controllable, reliable and feasible to form and pattern components such as gate conductors on even more reduced scales, consistently, robustly and reproducibly, preferably in a self-aligned manner.

The present invention is directed to overcoming, or at least reducing the effects of, one or more of the problems set forth above.

SUMMARY OF THE INVENTION

In one aspect of the present invention, a method is provided, the method including forming a gate dielectric layer above a substrate layer, forming a gate conductor layer above the gate dielectric layer, forming a first hard mask layer above the gate conductor layer, and forming a second hard mask layer above the first hard mask layer. The method also includes forming a trimmed photoresist mask above the second hard mask layer, and forming a patterned hard mask in the second hard mask layer using the trimmed photoresist mask to remove portions of the second hard mask layer, the patterned hard mask having a first dimension. The method further includes forming a selectively etched hard mask in the first hard mask layer by removing portions of the first hard mask layer adjacent the patterned hard mask, the selectively etched hard mask having a second dimension less than the first dimension, and forming a gate structure using the selectively etched hard mask to remove portions of the gate conductor layer above the gate dielectric layer.

In another aspect of the present invention, a semiconductor device is provided, formed by a method including forming a gate dielectric layer above a substrate layer, forming a gate conductor layer above the gate dielectric layer, forming a first hard mask layer above the gate conductor layer, and forming a second hard mask layer above the first hard mask layer. The method also includes forming a trimmed photoresist mask above the second hard mask layer, and forming a patterned hard mask in the second hard mask layer using the trimmed photoresist mask to remove portions of the second hard mask layer, the patterned hard mask having a first dimension. The method further includes forming a selectively etched hard mask in the first hard mask layer by removing portions of the first hard mask layer adjacent the patterned hard mask, the selectively etched hard mask having a second dimension less than the first dimension, and forming a gate structure using the selectively etched hard mask to remove portions of the gate conductor layer above the gate dielectric layer.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
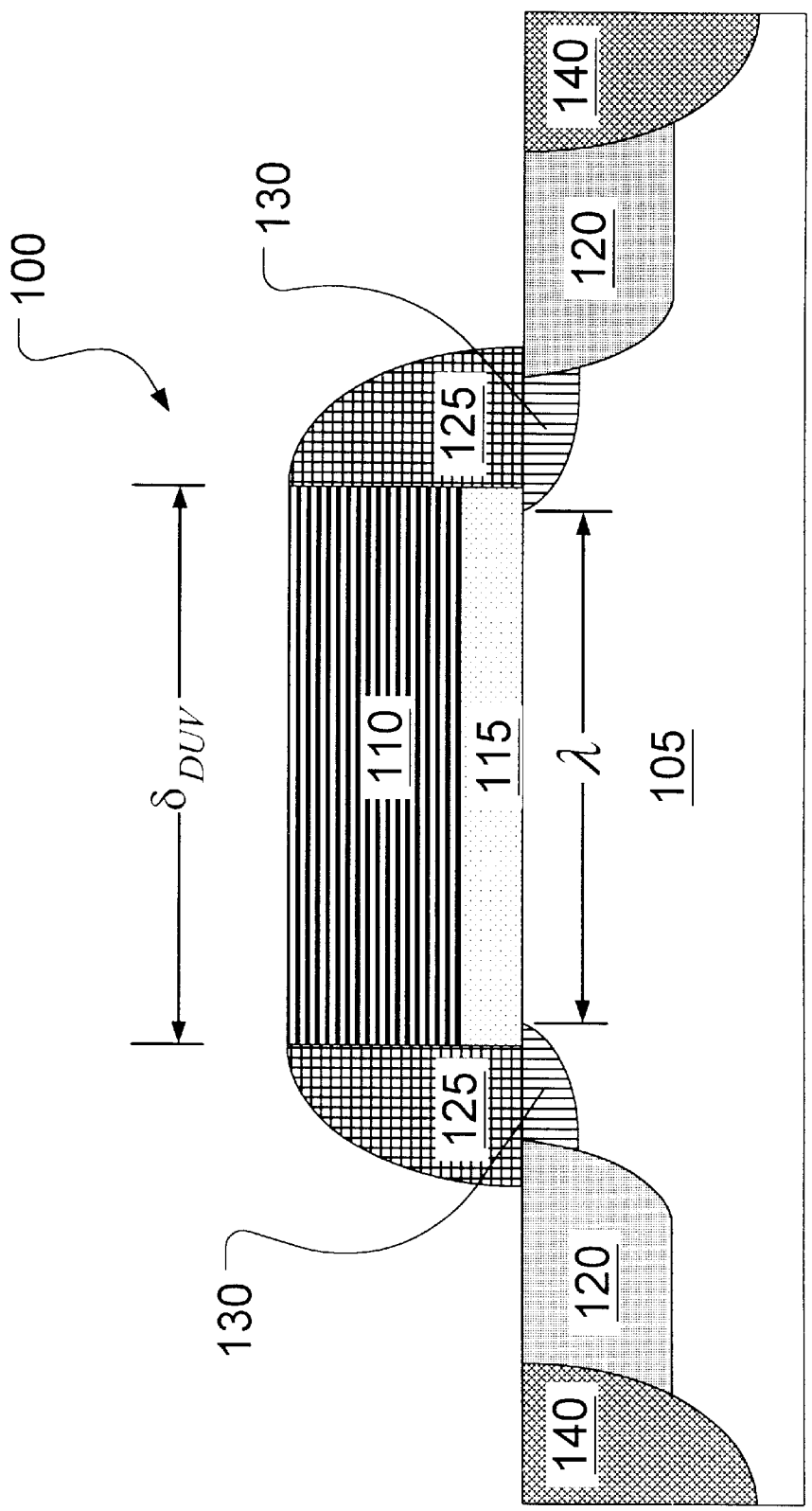
FIGS. 1–4 schematically illustrate a conventional approach to achieving reduced critical dimensions, resorting to expensive DUV photolithography and/or in high-energy electron beam lithography.
Figure 2:
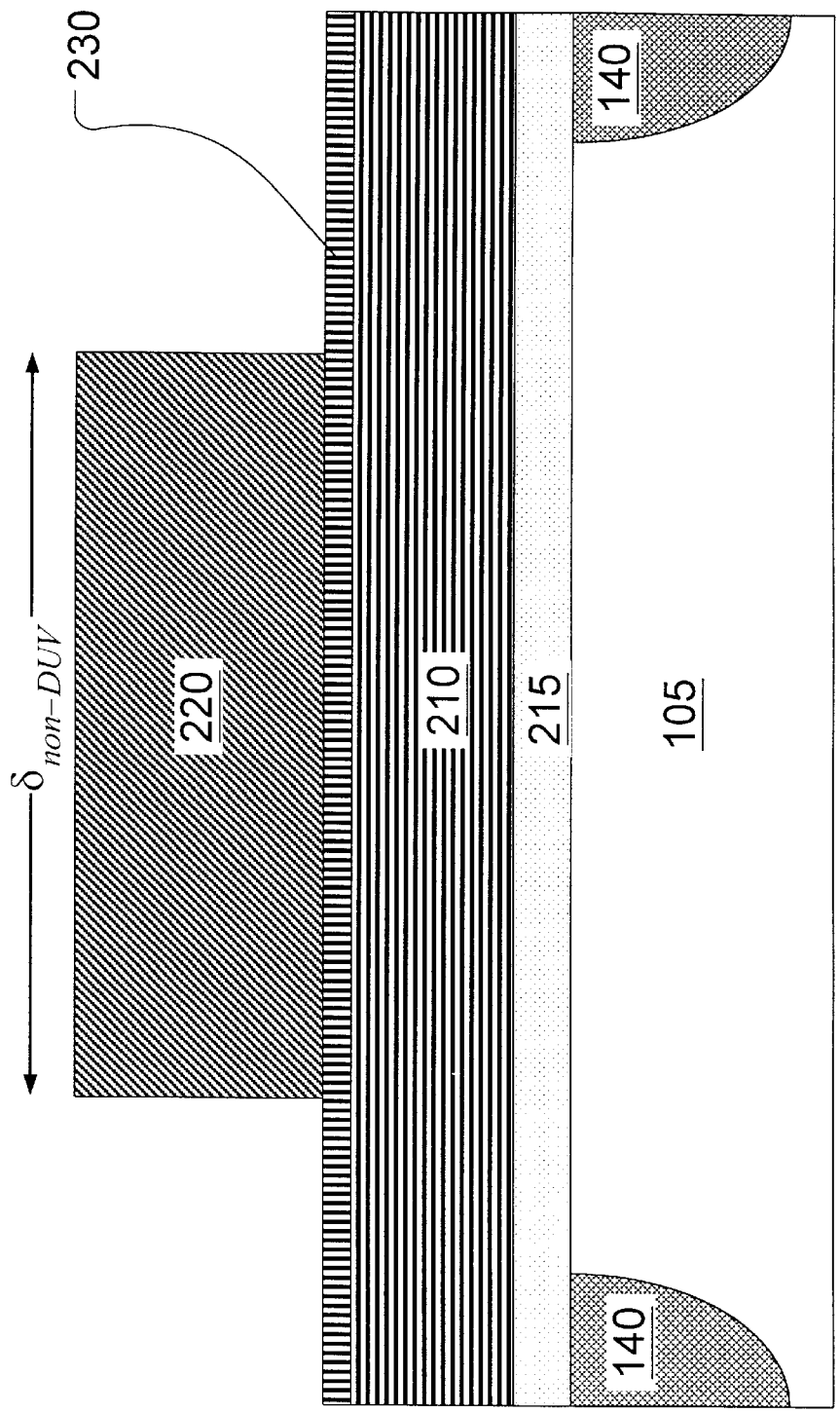
Figure 3:
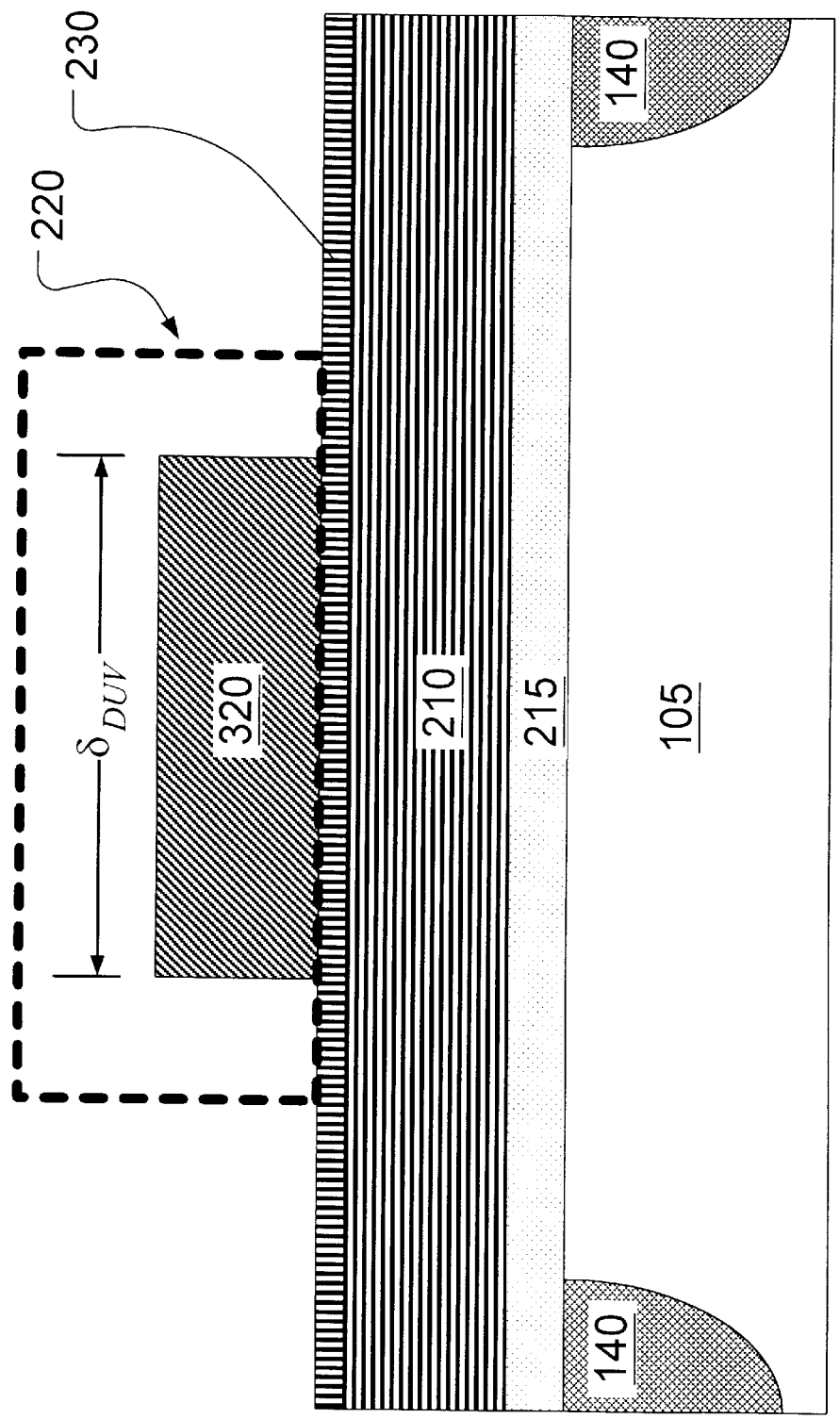
Figure 4:
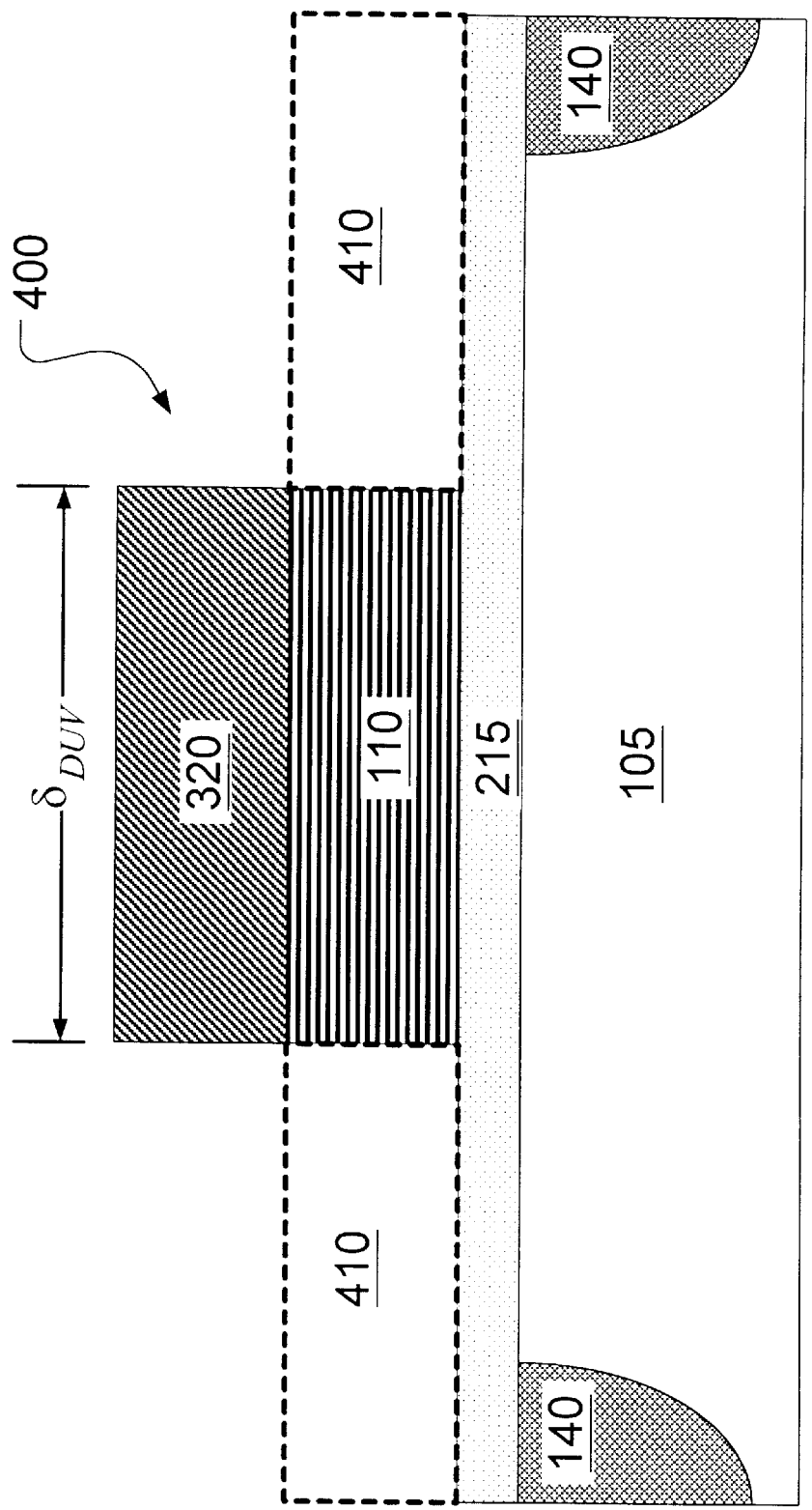

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 5–13. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 5:
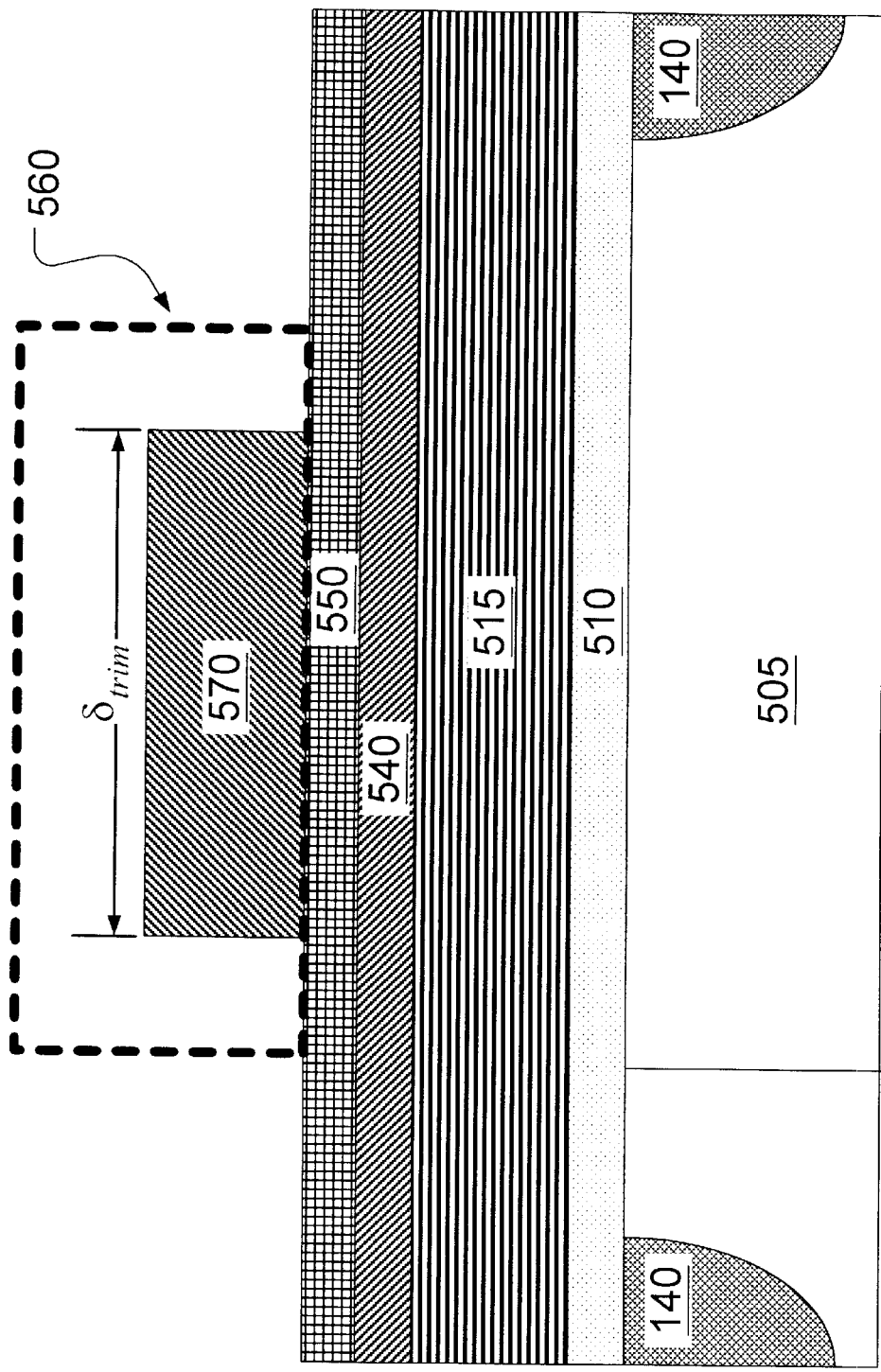
FIGS. 5–13 schematically illustrate a method for semiconductor device fabrication according to various embodiments of the present invention.

FIGS. 5–13 illustrate a method of forming an MOS transistor 1300 (FIG. 13) according to the present invention. As shown in FIG. 5, a dielectric layer 510 may be formed above an upper surface 550 of a semiconducting substrate 505, such as doped-silicon. The dielectric layer 510 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal growing, and the like. The dielectric layer 510 may have a thickness above the upper surface 550 ranging from approximately 20–50 Å, for example, and may be formed from a variety of dielectric materials and may, for example, be an oxide, an oxynitride, silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 510 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 510 may have an equivalent oxide thickness $t_{ox-eq}$ ranging from approximately 20–50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since C=K/t and $C_{ox}=K_{ox}/t_{ox-eq}$, then $t=K/C=K/C_{ox}=Kt_{ox-eq}/K_{ox}=Kt_{ox-eq}/4$, approximately. For example, the dielectric layer 510 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{ox-eq}/K_{ox}=24t_{ox-eq}/4$, approximately, an equivalent oxide thickness $t_{ox-eq}$ ranging from approximately 20–50 Å would correspond to a $Ta_2O_5$ thickness $t_{TaO}$ ranging from approximately 120–300 Å.

As shown in FIG. 5, a conductive layer 515 may be formed above the dielectric layer 510. The conductive layer 515 may be formed by a variety of known techniques, e.g., high-density ionized metal plasma (IMP) deposition, high-density inductively coupled plasma (ICP) deposition, sputtering, PVD, CVD, LPCVD, PECVD, and the like, and may have a thickness ranging from approximately 500–5000 Å. The conductive layer 515 may be formed of a variety of metals such as aluminum (Al), titanium (Ti), zirconium (Zr), tungsten (W), tantalum (Ta), nickel (Ni), molybdenum (Mo), cobalt (Co), and the like.

In various alternative illustrative embodiments, the conductive layer 515 may be a doped-poly conductive layer 515. The doped-poly conductive layer 515 may be formed by a variety of known techniques for forming such layers, e.g., CVD, LPCVD, PECVD, PVD, and the like, and may have a thickness ranging from approximately 500–5000 Å. In one illustrative embodiment, the doped-poly conductive layer 515 has a thickness of approximately 2000 Å and is formed by an LPCVD process for higher throughput.

The doped-poly conductive layer 515 may doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000–2000 Å, for example. The doping of the poly may conveniently be accomplished by diffusing or implanting the dopant atoms and/or molecules through the upper surface of the poly. The doped-poly conductive layer 515 may then be subjected to a heat-treating process that may be a rapid thermal anneal (RTA) process performed at a temperature ranging from approximately 800–1100° C. for a time ranging from approximately 5–60 seconds.

As shown in FIG. 5, a first hard mask layer 540 may be formed above the conductive layer 515, and a second hard mask layer 550 may be formed above the first hard mask layer 540. Preferably, the first and second hard mask layers 540 and 550 are formed of different materials so that selective etching may be used to pattern the first and second hard mask layers 540 and 550 differently, as described more fully below.

The first and second hard mask layers 540 and 550 may be formed from a variety of dielectric materials and one or both may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. The first and second hard mask layers 540 and 550 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like.

The first and second hard mask layers 540 and 550 may be formed by a variety of known techniques for forming such layers, e.g., chemical vapor deposition (CVD), low-pressure CVD (LPCVD), plasma-enhanced CVD (PECVD), sputtering, physical vapor deposition (PVD), thermal growing, and the like. The first and second hard mask layers 540 and 550 may each have thicknesses in a range of about 500–5500 Å. In one illustrative embodiment, the first hard mask layer 540 is comprised of silicon nitride ($Si_3N_4$), having a thickness of approximately 1000 Å, formed by being blanket-deposited by an LPCVD process, and the second hard mask layer 550 is comprised of silicon dioxide ($SiO_2$), also having a thickness of approximately 1000 Å, also formed by being blanket-deposited by an LPCVD process.

As shown in FIG. 5, a non-DUV patterned photoresist layer 560 (indicated in phantom), patterned using non-DUV lithography, is formed above the second hard mask layer 550. The non-DUV patterned photoresist layer 560 is trimmed using a controlled photoresist trim to form a trimmed photoresist mask 570. The non-DUV patterned photoresist layer 560 may be trimmed, using an oxygen plasma ($O_2$-plasma), for example. The trimmed photoresist mask 570 will typically have the critical dimension $\delta_{trim}$ that may be about 1100 Å that will determine the size of the $N^+$-doped-poly ($P^+$-doped-poly) gate 110 and the gate oxide 115. In various illustrative alternative embodiments, a more expensive patterned photoresist layer (not shown), patterned using DUV lithography and/or high-energy electron beam lithography, could be used, and subsequently trimmed, instead of the non-DUV patterned photoresist layer 560. In various other illustrative alternative embodiments, a more expensive patterned photoresist mask (not shown), patterned using DUV lithography and/or high-energy electron beam lithography, could be used instead of the trimmed photoresist mask 570.

Figure 6:
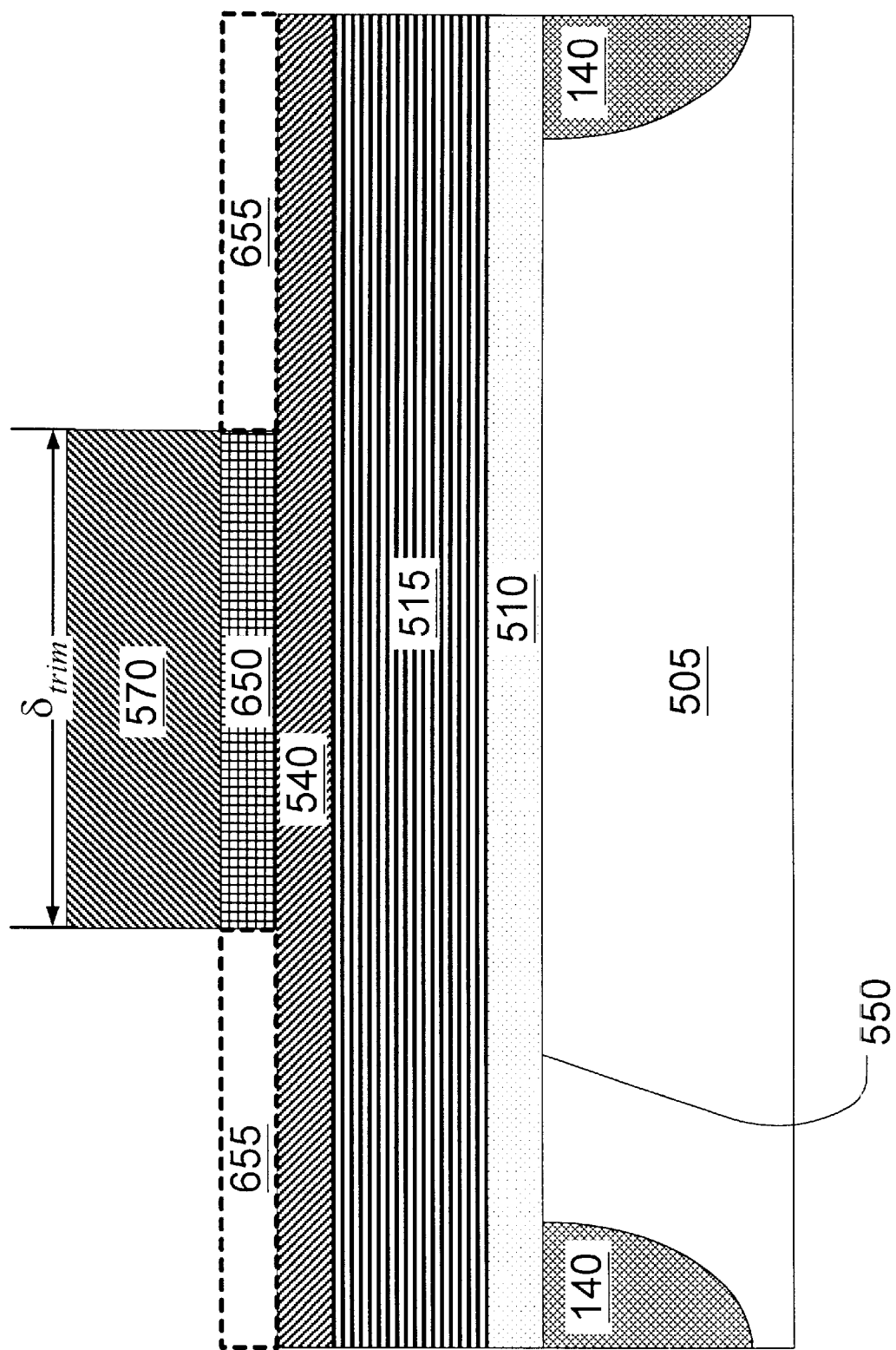

As shown in FIG. 6, the trimmed photoresist mask 570 having the critical dimension $\delta_{trim}$ is then used as a mask to form a patterned hard mask 650 by removing portions 655 (shown in phantom) of the second hard mask layer 550 not protected by the trimmed photoresist mask 570, using an anisotropic etching process, for example. The patterned hard mask 650 will have the critical dimension $\delta_{trim}$ defined by the trimmed photoresist mask 570.

As shown in FIGS. 5–6, the patterned hard mask 650 may be formed using a variety of known etching techniques, such as an anisotropic etching process. A selective anisotropic etching technique may be used, such as a reactive ion etching (RIE) process using octafluorocyclobutane ($C_4F_8$), and/or tetrafluoromethane (carbon tetrafluoride, $CF_4$), and argon (Ar) as the etchant gases, for example. Alternatively, a reactive ion etching (RIE) process with trifluoromethane (fluoroform, $CHF_3$) and argon (Ar) as the etchant gases may be used, for example. Plasma etching may also be used, in various illustrative embodiments.

Figure 7:
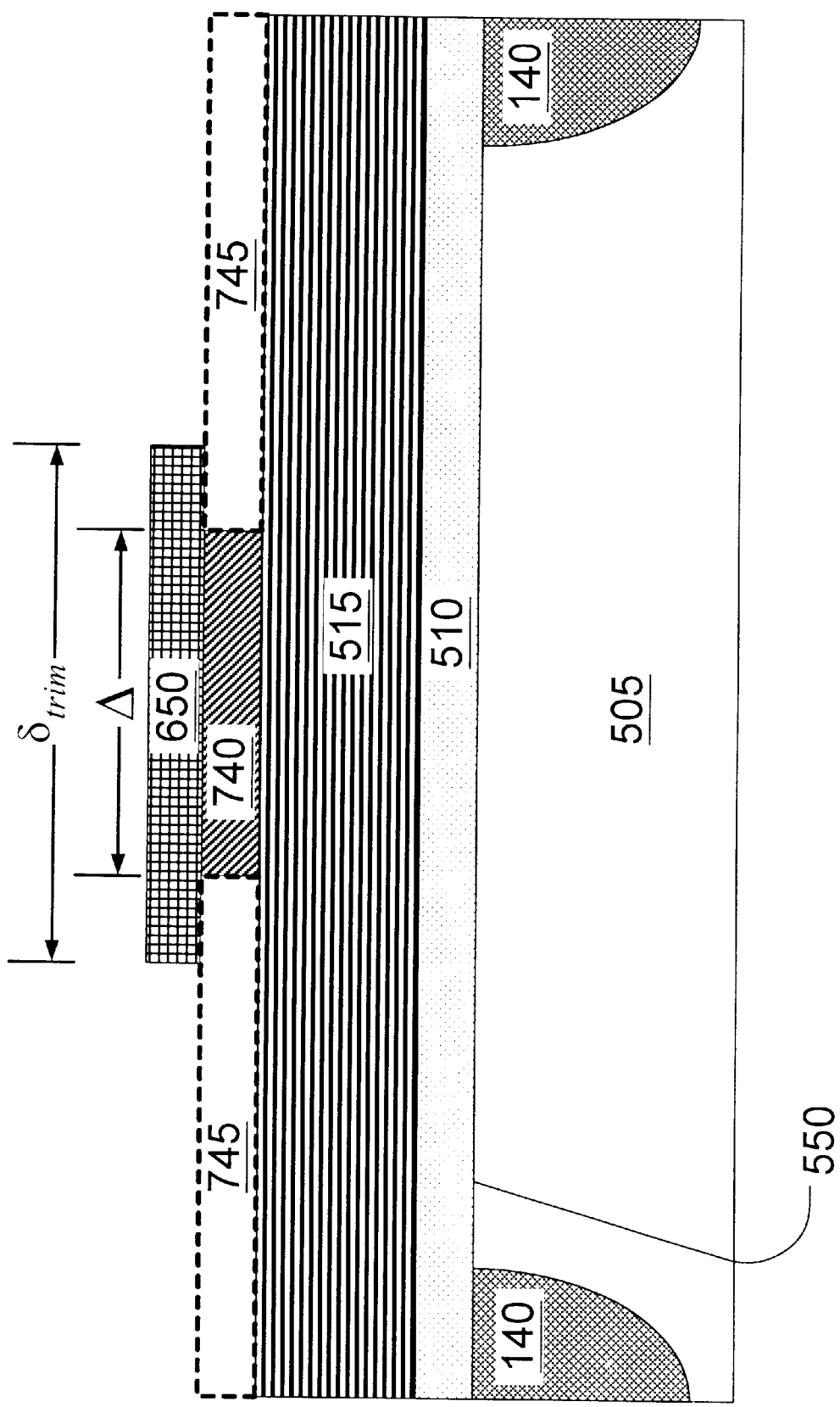

As shown in FIG. 7, the trimmed photoresist mask 570 having the critical dimension $\delta_{trim}$ (FIGS. 5–6) may be removed, by being stripped away, for example. As shown in FIG. 7, using an etching process selective to the conductive layer 515 and the patterned hard mask 650, a selectively etched hard mask 740 may be formed by removing portions 745 (shown in phantom) of the first hard mask layer 540 adjacent the patterned hard mask 650. The selectively etched hard mask 740 may be formed by using a variety of known selective isotropic wet etching techniques, such as using phosphoric acid ($H_3PO_4$). For example, when hot aqueous phosphoric acid ($H_3PO_4$) is used to selectively etch a silicon nitride ($Si_3N_4$) first hard mask layer 540, the $Si_3N_4$ etches away fairly steadily, at least at roughly ten times the etch rate of a silicon dioxide ($SiO_2$) second hard mask layer 550.

As shown in FIG. 7, the selectively etched hard mask 740 may have a critical dimension $\Delta$ that may be about 300–900 Å that is less than the critical dimension $\delta_{trim}$ of the patterned hard mask 650. Preferably, the critical dimension $\Delta$ is substantially smaller than the critical dimension $\delta_{trim}$ of the patterned hard mask 650. The patterned hard mask 650 inherited the critical dimension $\delta_{trim}$ from the trimmed photoresist mask 570. The selective etching of the selectively etched hard mask 740, according to any of the various illustrative embodiments of the present invention, is more controllable, reliable and feasible than further trimming of the trimmed photoresist mask 570 would be. Consequently, the selective etching of the selectively etched hard mask 740, according to any of the various illustrative embodiments of the present invention, is sufficiently controllable, reliable and feasible to be used to form and pattern components such as gate conductors and gate dielectrics on more reduced scales, such as sub-100 nanometer scales, consistently, robustly and reproducibly, and in a self-aligned manner.

Figure 8:
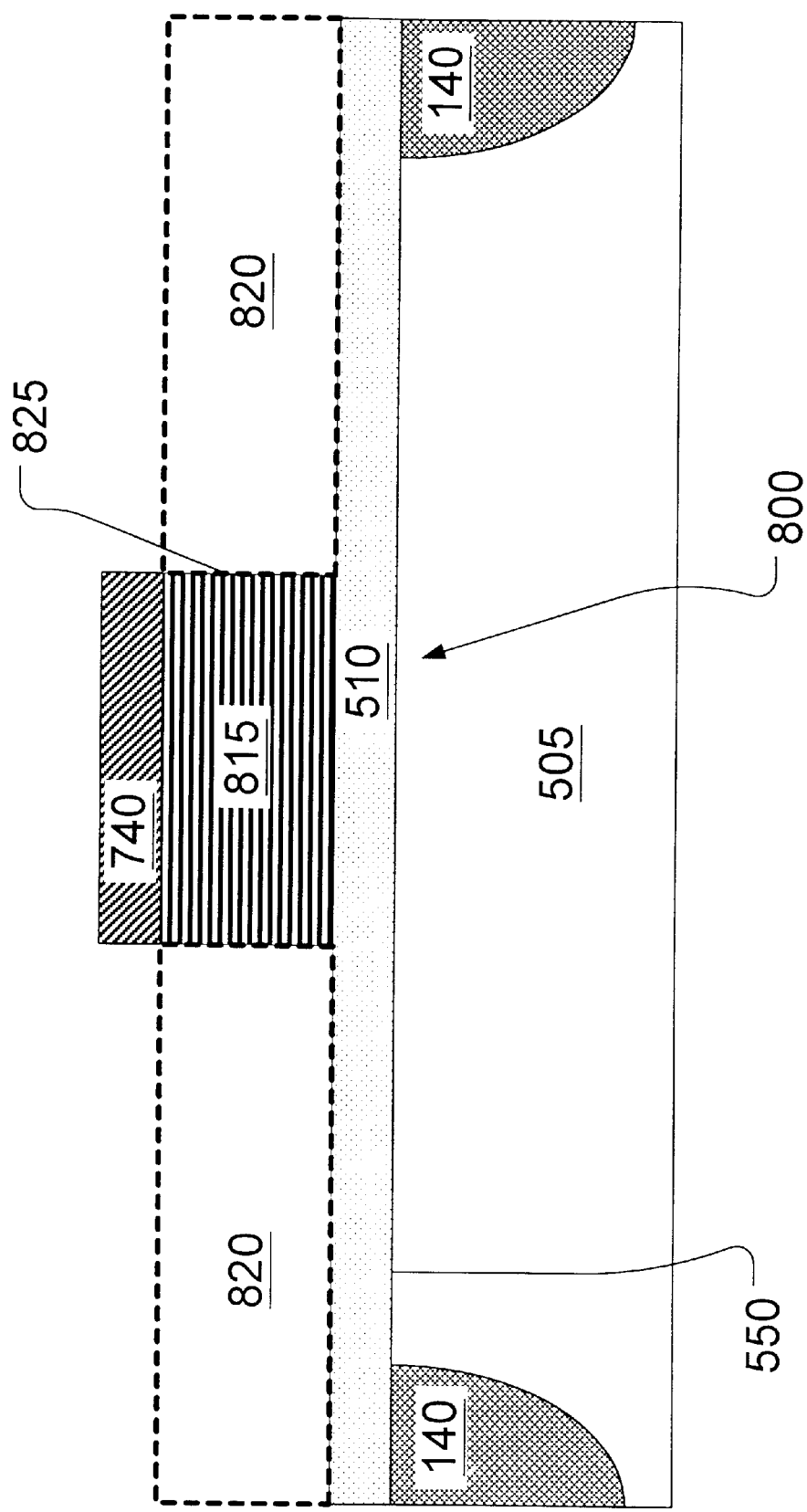

As shown in FIG. 8, the patterned hard mask 650 (FIGS. 6–7) may be removed, by an isotropic and/or an anisotropic etching technique, such as a reactive ion etching (RIE) process using trifluoromethane (fluoroform, $CHF_3$) and argon (Ar) the etchant gases, for example. Alternatively, a wet etching technique may be used, for example. Plasma etching may also be used, in various illustrative embodiments.

As shown in FIG. 8, respective portions 820 (shown in phantom) of the conductive layer 515 (FIGS. 5–7) not protected by the selectively etched hard mask 740 may be removed, by being etched away, for example, forming the structure 800. The structure 800 may have an edge 825. The structure 800 includes the gate conductor 815 and a portion of the gate dielectric layer 510 that will eventually become gate dielectric 910 (FIG. 9) after subsequent etching and/or processing. As shown in FIG. 8, the structure 800 may be formed using a variety of known photolithography and etching techniques, such as an anisotropic etching process using hydrogen bromide (HBr) and/or chlorine ($Cl_2$) and argon (Ar) as the etchant gases, for example.

Figure 9:
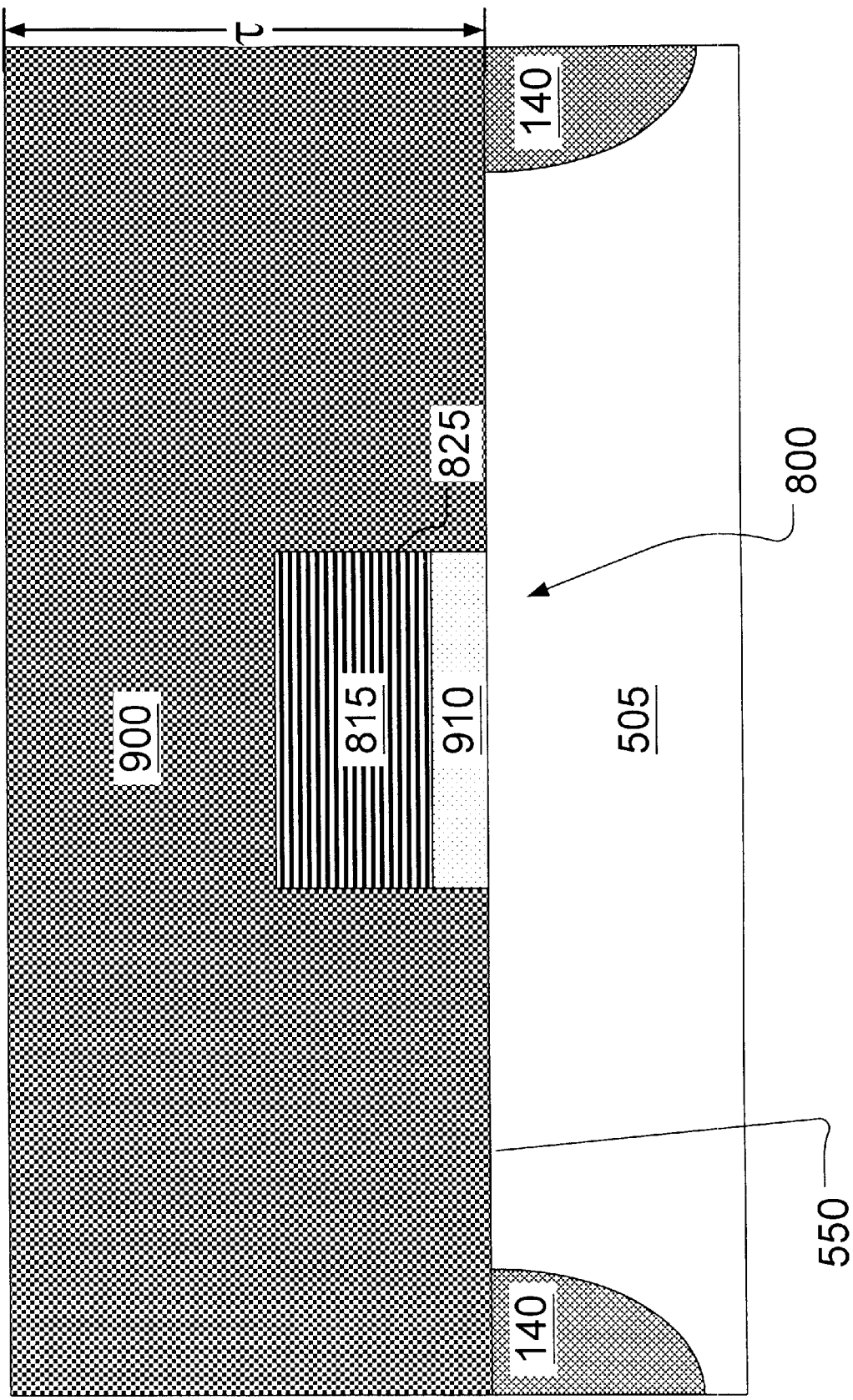

As shown in FIG. 9, the selectively etched hard mask 740 (FIGS. 7–8) may be removed, by an isotropic and/or an anisotropic etching technique. As shown in FIG. 9, a masking layer 900, formed of photoresist, for example, may be formed above the upper surface 550 of the semiconducting substrate 505, and above and adjacent the structure 800. The masking layer 800 may have a thickness τ above the upper surface 550 ranging from approximately 500–5000 Å, for example. In various illustrative embodiments, the thickness τ above the upper surface 550 is about 5000 Å. In various alternative illustrative embodiments, the thickness τ above the upper surface 550 ranges from approximately 500–1000 Å.

Figure 10:
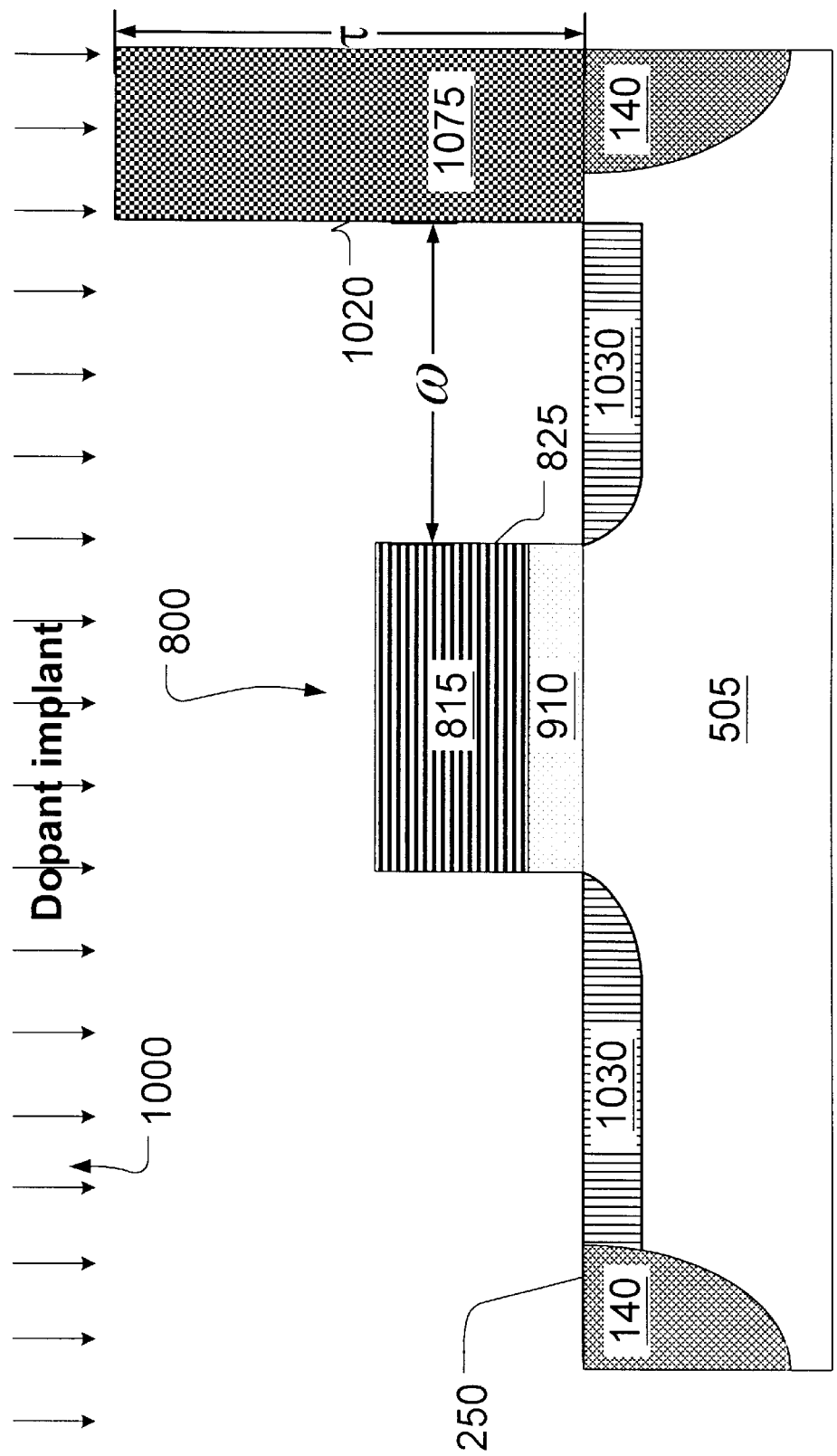

As shown in FIG. 10, the masking layer 900 may be patterned to form the mask 1075 above at least a portion of the shallow trench isolation (STI) 140. The masking layer 900 may be patterned to form the mask 1075 using a variety of known photolithography and/or etching techniques. The mask 1075 may have an edge 1020 spaced apart from the edge 825 of the structure 800 by a distance ω ranging from approximately 1000–5500 Å, for example.

The mask 1075 may be formed over the STI region 140, as in conventional CMOS fabrication methods, to protect the PMOS (NMOS) transistor regions while the NMOS (PMOS) transistor regions are being implanted to form $N^-$-doped ($P^-$-doped) regions 1030, for example. As shown in FIG. 10, a dopant implant 1000 (indicated by the arrows) may be implanted to form the $N^-$-doped ($P^-$-doped) regions 1030. After activation, the $N^-$-doped ($P^-$-doped) regions 1030 become the $N^-$-doped ($P^-$-doped) SDE regions 1130 (FIG. 11).

Figure 13:
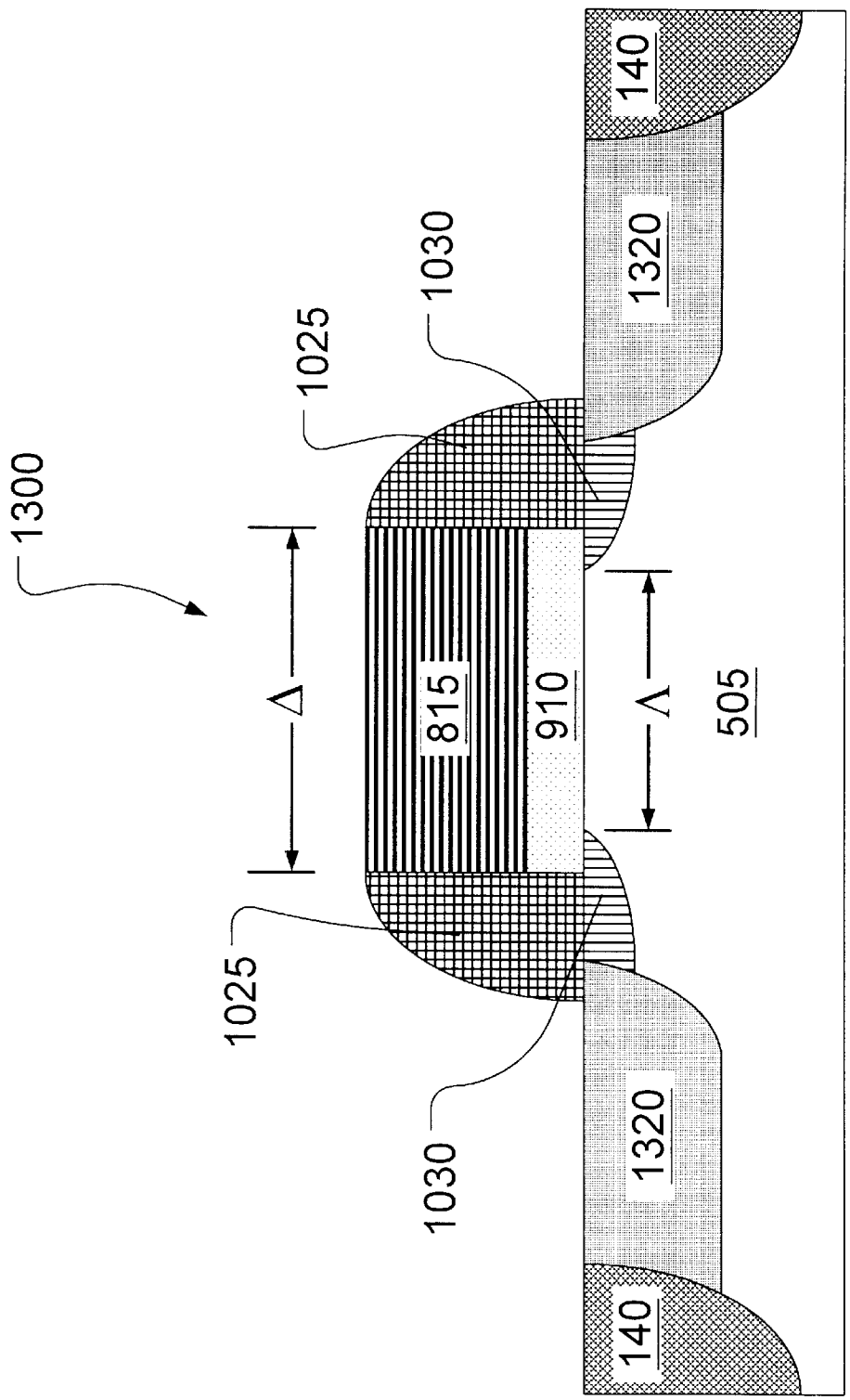

In various illustrative embodiments, the $N^-$-doped ($P^-$-doped) regions 1030 may be formed by being implanted with an SDE dose of As (for $N^-$-doping appropriate for an NMOS transistor 1300, FIG. 13) or $BF_2$ (for $P^-$-doping appropriate for a PMOS transistor 1300, FIG. 13). The SDE dose may range from about $1.0 \times 10^{14}$–$1.0 \times 10^{15}$ ions/cm$^2$ at an implant energy ranging from about 3–50 keV. The $N^-$-doped ($P^-$-doped) regions 1030 may be subjected to an RTA process performed at a temperature ranging from approximately 800–1100° C. for a time ranging from approximately 5–60 seconds. The RTA process may activate the implant and form a more sharply defined and less graded activated implant junction with the substrate 505 than would an RTA process following an implant with an SDE dose of more mobile P (for $N^-$-doping appropriate for an NMOS transistor 1300) or B (for $P^-$-doping appropriate for a PMOS transistor 1300).

Figure 11:
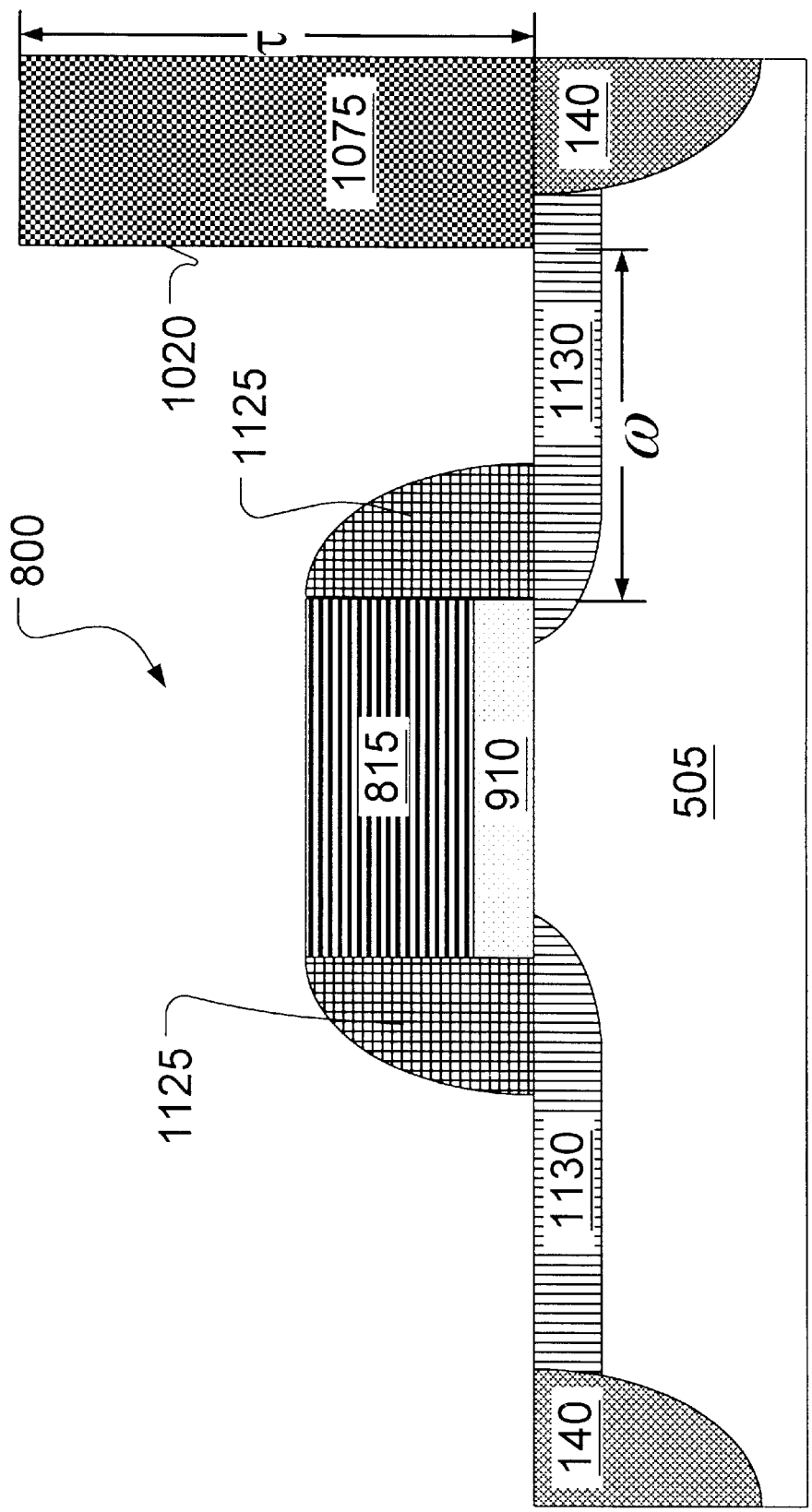

As shown in FIG. 11, dielectric spacers 1125 may be formed adjacent the structure 800, either before or after the $N^-$-doped ($P^-$-doped) regions 1030 are activated to become the $N^-$-doped ($P^-$-doped) SDE regions 1130. As shown in FIG. 11, dielectric spacers 1125 may be formed by a variety of techniques above the $N^-$-doped ($P^-$-doped) SDE regions 1130 and adjacent the structure 800. For example, the dielectric spacers 1125 may be formed by depositing a conformal layer (not shown) of the appropriate material above and adjacent the structure 800, and then performing an anisotropic RIE process on the conformally blanket-deposited layer. The dielectric spacers 1125 may each have a base thickness ranging from approximately 300–1500 Å, for example, measured from the edge 825 of the structure 800.

The dielectric spacers 1125, like the gate dielectric 515, may be formed from a variety of dielectric materials and may, for example, be an oxide, a nitride, an oxynitride, silicon dioxide ($SiO_2$), nitrogen-bearing $SiO_2$, silicon nitride ($Si_3N_4$), silicon oxynitride ($Si_xO_yN_z$), and the like. The dielectric spacers 1125 may also be formed of any suitable "low dielectric constant" or "low K" material, where K is less than or equal to about 4. Additionally, the dielectric spacers 1125 may be comprised of a fluorine-doped oxide, a fluorine-doped nitride, a fluorine-doped oxynitride, a fluorine-doped low K material, and the like. In one illustrative embodiment, the dielectric spacers 1125 are comprised of $SiO_2$, having a base thickness of approximately 300 Å.

Figure 12:
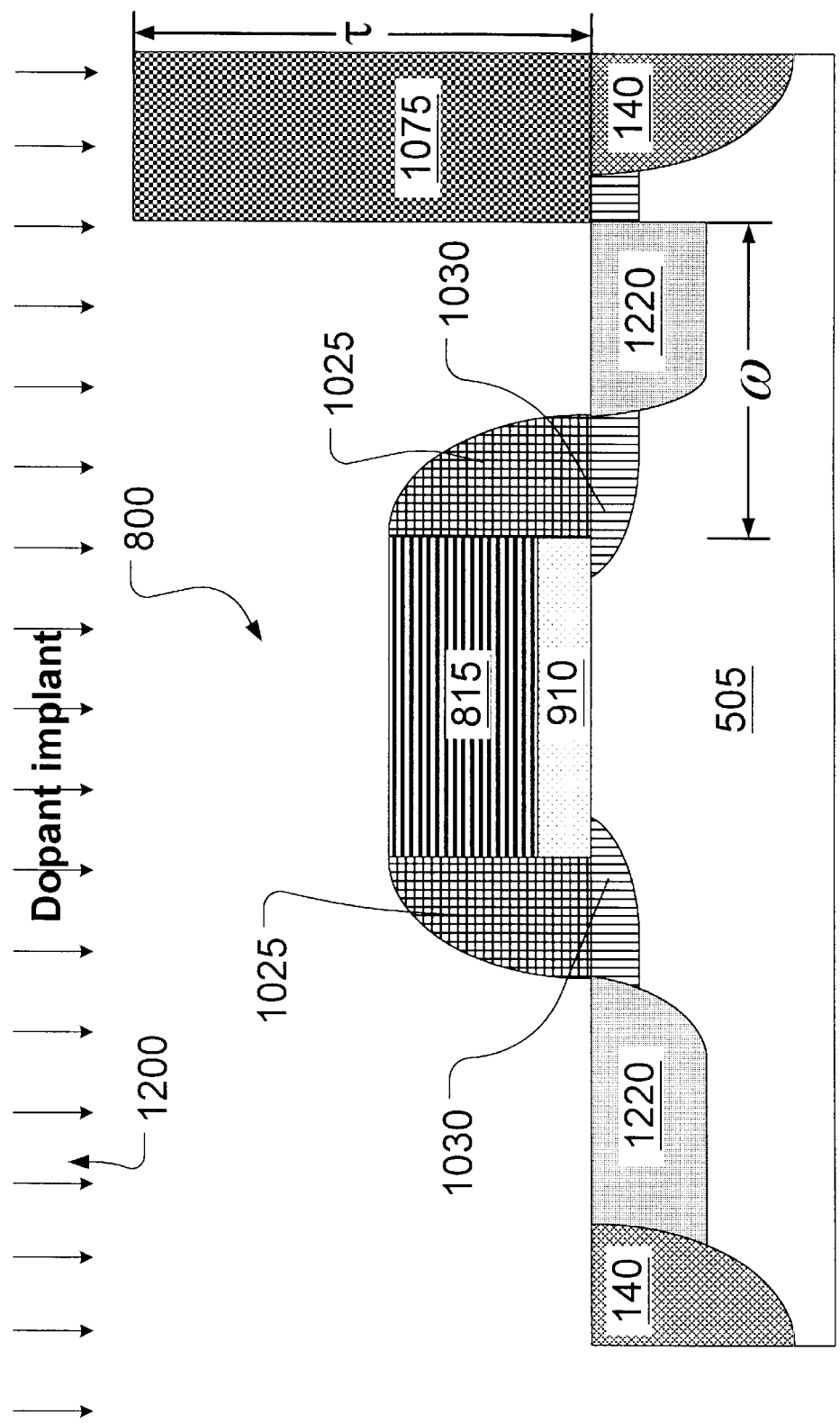

As shown in FIG. 12, a dopant 1200 (indicated by arrows) may be implanted to introduce dopant atoms and/or molecules to form $N^+$-doped ($P^+$-doped) regions 1220. After activation, the $N^+$-doped ($P^+$-doped) regions 1220 become $N^+$-doped ($P^+$-doped) source/drain regions 1320 (FIG. 13). In one illustrative embodiment, a dose of the dopant 1200 atoms and/or molecules may range from approximately $1.0 \times 10^{15}$–$5.0 \times 10^{15}$ ions/cm$^2$ of the appropriate dopant 1200 atoms and/or molecules, e.g., P for an illustrative NMOS transistor or B for an illustrative PMOS transistor. An implant energy of the dopant 1200 atoms and/or molecules may range from approximately 30–100 keV. In another illustrative embodiment, a dose of the dopant 1200 atoms is approximately $1.0 \times 10^{15}$ ions/cm$^2$ of P for an NMOS transistor or B for a PMOS transistor at an implant energy of approximately 30 keV.

The dopant 1200 may be an $N^+$ implant such as P, As, antimony (Sb), bismuth (Bi), and the like, and may form heavily doped $N^+$ source/drain regions 1320. An $N^+$ implant would be appropriate for the fabrication of an NMOS transistor 1300, for example. Alternatively, the dopant 1200 may be a $P^+$ implant such as B, boron fluoride (BF, $BF_2$), aluminum (Al), gallium (Ga), Indium (In), Thallium (Tl), and the like, and may form heavily doped $P^+$ source/drain regions 1320. A $P^+$ implant would be appropriate for the fabrication of a PMOS transistor 1300, for example.

As shown in FIG. 13, the $N^+$-doped ($P^+$-doped) regions 1220 may be subjected to an RTA process performed at a temperature ranging from approximately 800–1100° C. for a time ranging from approximately 5–60 seconds to form the N+-doped (P+-doped) source/drain regions 1320. The RTA process may activate the implant of the more mobile P (for N+-doping appropriate for an NMOS transistor 1300) or B (for P+-doping appropriate for a PMOS transistor 1300) and form a less sharply defined and more graded activated implant junction with the structure 505 than would an RTA process following an implant with a source/drain dose of less mobile As (for N+-doping appropriate for an NMOS transistor 1300) or BF$_2$ (for P+-doping appropriate for a PMOS transistor 1300).

Alternatively, an RTA process to diffuse and activate the N+-doped (P+-doped) regions 1220 to form the N+-doped (P+-doped) source/drain regions 1320 may be performed in conjunction with a self-aligned silicidation (salicidation) process (not shown), either prior to, during or following the salicidation. Such a salicidation-conjoined RTA process may be performed at a temperature ranging from approximately 800–1000° C. for a time ranging from approximately 10–60 seconds.

Any of the above-disclosed embodiments of a method of manufacturing semiconductor devices with reduced critical dimensions enables the formation and patterning of components such as gate conductors and gate dielectrics on much reduced scales, consistently, robustly and reproducibly, and in a self-aligned manner. Any of the above-disclosed embodiments of a method of manufacturing semiconductor devices with reduced critical dimensions enables the achievement of reduced critical dimensions without resorting to expensive DUV photolithography and/or in high-energy electron beam lithography. The selective etching of the selectively etched hard mask 740 (FIG. 7), according to any of the various illustrative embodiments of the present invention, enables a structure 800 of a MOS transistor 1300 to have a critical dimension Δ that may be about 600–1100 Å that effectively determines a channel length Λ that may be about 500–1000 Å of the MOS transistor 1300. The selective etching of the selectively etched hard mask 740 (FIG. 7), according to any of the various illustrative embodiments of the present invention, is more controllable, reliable and feasible than further trimming of the trimmed photoresist mask 570 (FIG. 5) would be. Consequently, the selective etching of the selectively etched hard mask 740, according to any of the various illustrative embodiments of the present invention, is sufficiently controllable, reliable and feasible to be used to form and pattern components such as gate conductors and gate dielectrics on more reduced scales, such as sub-100 nanometer scales, consistently, robustly and reproducibly, and in a self-aligned manner.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, every range of values (of the form, "from about a to about b," or, equivalently, "from approximately a to b," or, equivalently, "from approximately a–b") disclosed herein is to be understood as referring to the power set (the set of all subsets) of the respective range of values, in the sense of Georg Cantor. Accordingly, the protection sought herein is as set forth in the claims below.

What is claimed:

1. A method comprising:
    forming a gate dielectric layer above a substrate layer;
    forming a gate conductor layer above the gate dielectric layer;
    forming a first hard mask layer above the gate conductor layer;
    forming a second hard mask layer above the first hard mask layer;
    forming a trimmed photoresist mask above the second hard mask layer;
    forming a patterned hard mask in the second hard mask layer using the trimmed photoresist mask to remove portions of the second hard mask layer, the patterned hard mask having a first dimension;
    forming a selectively etched hard mask in the first hard mask layer by removing portions of the first hard mask layer adjacent the patterned hard mask, the selectively etched hard mask having a second dimension less than the first dimension; and
    forming a gate structure using the selectively etched hard mask to remove portions of the gate conductor layer above the gate dielectric layer.

2. The method of claim 1, wherein forming the gate dielectric layer includes forming the gate dielectric layer out of one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate.

3. The method of claim 1, wherein forming the gate dielectric layer includes forming the gate dielectric layer using one of chemical vapor deposition (CVD), low-pressure CVD (LPCVD), plasma-enhanced CVD (PECVD), sputtering, physical vapor deposition (PVD), and thermal growing.

4. The method of claim 1, wherein forming the gate dielectric layer includes forming the gate dielectric layer to have an equivalent oxide thickness $t_{ox-eq}$ ranging from approximately 20–50 Å.

5. The method of claim 1, wherein forming the gate conductor layer includes forming the gate conductor layer out of one of doped-poly, aluminum (Al), titanium (Ti), zirconium (Zr), tungsten (W), tantalum (Ta), nickel (Ni), molybdenum (Mo), and cobalt (Co).

6. The method of claim 1, wherein forming the gate conductor layer includes forming the gate conductor layer using one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

7. The method of claim 1, wherein forming the gate conductor layer includes forming the gate conductor layer to have a thickness ranging from approximately 500–5000 Å.

8. The method of claim 1, wherein forming the first and second hard mask layers includes forming the first and second hard mask layers out of two different ones of an oxide, an oxynitride, silicon dioxide, silicon nitride, a nitrogen-bearing oxide, a nitrogen-doped oxide, silicon oxynitride, a high dielectric constant (high K), where K is at least about 8, titanium oxide, tantalum oxide, barium strontium titanate, and forming the first and second hard mask layers using one of chemical vapor deposition (CVD), low-pressure CVD (LPCVD), plasma-enhanced CVD (PECVD), sputtering, physical vapor deposition (PVD), and thermal growing.

9. The method of claim 8, wherein forming the first hard mask layer includes forming the first hard mask layer out of silicon nitride, and forming the second hard mask layer includes forming the second hard mask layer out of silicon dioxide.

10. The method of claim 1, wherein forming the selectively etched hard mask includes forming the selectively etched hard mask to have a critical dimension of at most about 1000 Å.

11. A method comprising:

forming a gate dielectric layer above a substrate layer;

forming a gate conductor layer above the gate dielectric layer;

forming a first hard mask layer above the gate conductor layer;

forming a second hard mask layer above the first hard mask layer;

forming and patterning a photoresist mask above the second hard mask layer;

forming a trimmed photoresist mask by trimming the photoresist mask;

forming a patterned hard mask in the second hard mask layer using the trimmed photoresist mask to remove portions of the second hard mask layer, the patterned hard mask having a first dimension;

removing the trimmed photoresist mask;

forming a selectively etched hard mask in the first hard mask layer by removing portions of the first hard mask layer adjacent the patterned hard mask, the selectively etched hard mask having a second dimension less than the first dimension; and forming a gate structure using the selectively etched hard mask to remove portions of the gate conductor layer above the gate dielectric layer.

12. The method of claim 11, wherein forming the gate dielectric layer includes forming the gate dielectric layer out of one of an oxide, an oxynitride, silicon dioxide, a nitrogen-bearing oxide, a nitrogen-doped oxide, silicon oxynitride, a high dielectric constant (high K), where K is at least about 8, titanium oxide, tantalum oxide, barium strontium titanate.

13. The method of claim 11, wherein forming the gate dielectric layer includes forming the gate dielectric layer using one of chemical vapor deposition (CVD), low-pressure CVD (LPCVD), plasma-enhanced CVD (PECVD), sputtering, physical vapor deposition (PVD), and thermal growing.

14. The method of claim 11, wherein forming the gate dielectric layer includes forming the gate dielectric layer to have an equivalent oxide thickness $t_{ox-eq}$ ranging from approximately 20–50 Å.

15. The method of claim 11, wherein forming the gate conductor layer includes forming the gate conductor layer out of one of doped-poly, aluminum (Al), titanium (Ti), zirconium (Zr), tungsten (W), tantalum (Ta), nickel (Ni), molybdenum (Mo), and cobalt (Co).

16. The method of claim 11, wherein forming the gate conductor layer includes forming the gate conductor layer using one of chemical vapor deposition (CVD), low-pressure CVD (LPCVD), plasma-enhanced CVD (PECVD), sputtering, physical vapor deposition (PVD), high-density ionized metal plasma (IMP) deposition, and high-density inductively coupled plasma (ICP) deposition.

17. The method of claim 11, wherein forming the gate conductor layer includes forming the gate conductor layer to have a thickness ranging from approximately 500–5000 Å.

18. The method of claim 11, wherein forming the first and second hard mask layers includes forming the first and second hard mask layers out of two different ones of an oxide, an oxynitride, silicon dioxide, silicon nitride, a nitrogen-bearing oxide, a nitrogen-doped oxide, silicon oxynitride, a high dielectric constant (high K), where K is at least about 8, titanium oxide, tantalum oxide, barium strontium titanate, and forming the first and second hard mask layers using one of chemical vapor deposition (CVD), low-pressure CVD (LPCVD), plasma-enhanced CVD (PECVD), sputtering, physical vapor deposition (PVD), and thermal growing.

19. The method of claim 18, wherein forming the first hard mask layer includes forming the first hard mask layer out of silicon nitride, and forming the second hard mask layer includes forming the second hard mask layer out of silicon dioxide.

20. The method of claim 11, wherein forming the selectively etched hard mask includes forming the selectively etched hard mask to have a critical dimension of at most about 1000 Å.

* * * * *